US006500268B1

(12) United States Patent
Henley

(10) Patent No.: US 6,500,268 B1
(45) Date of Patent: Dec. 31, 2002

(54) DRY CLEANING METHOD

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 09/642,460

(22) Filed: Aug. 18, 2000

(51) Int. Cl.$^7$ .................................................. B08B 6/00
(52) U.S. Cl. ............................. 134/1; 134/1.3; 134/21; 134/25.1; 134/26; 15/1.51
(58) Field of Search ............................. 134/1, 1.3, 21, 134/25.1, 26; 15/1.51

(56) References Cited

U.S. PATENT DOCUMENTS

| | | |
|---|---|---|
| 4,744,833 A | 5/1988 | Cooper et al. .................. 134/1 |
| 5,024,968 A | 6/1991 | Engelsberg .................. 437/173 |
| 5,099,557 A | 3/1992 | Engelsberg ................. 29/25.01 |
| 5,125,124 A | 6/1992 | Saeki et al. ................... 15/1.51 |
| 5,228,206 A | 7/1993 | Grant et al. ....................... 34/1 |
| 5,584,938 A | 12/1996 | Douglas ..................... 134/1.3 |
| 5,891,256 A | 4/1999 | Mohindra et al. ............. 134/2 |

OTHER PUBLICATIONS

D.W. Cooper et al. Electrostatic removal of particles from surfaces. Proceeds of a Symposium on Particles on Surfaces. Plenum Press, New York. ISBN 0-306-43030-4.*

* cited by examiner

*Primary Examiner*—Frankie L. Stinson
*Assistant Examiner*—M. Kornakov
(74) *Attorney, Agent, or Firm*—Towsend & Towsend & Crew LLP

(57) ABSTRACT

A method for cleaning objects (e.g., wafers, integrated circuits, photonic devices, opto-electronic devices, piezo-electronic devices, microelectromechanical systems ("MEMS"), sensors, actuators, solar cells, flat panel displays (e.g., LCD, AMLCD), biological and biomedical devices) of particles (e.g., particulate contamination) that attach themselves to surfaces of the objects. The method includes applying a high energy laser source on a surface of a substrate to release one or more particles from the surface of the substrate while maintaining the substrate in a vacuum environment; and applying an electrostatic source directed to the substrate to attract the released one or more particles from the substrate to remove the one or more particles from the surface of the substrate. The method also removes the substrate from the vacuum environment.

24 Claims, 6 Drawing Sheets

DRY CLEANING METHOD

CROSS REFERENCES TO RELATED APPLICATIONS

The following three applications are being filed on the same date, where one is this application, and the others are related. The related applications are hereby incorporated by reference for all purposes:

U.S. Ser. No. 09/642,460, in the name of Francois J. Henley, and titled An Improved Dry Cleaning Method;

U.S. Ser. No. 09/642,246, in the name of Francois J. Henley and titled An Improved Dry Cleaning System and Computer Code; and U.S. Ser. No. 09/642,246, in the name of Francois J. Henley and titled An Improved Dry Cleaning Method for the Manufacture of Integrated Circuits

BACKGROUND OF THE INVENTION

The present invention relates to techniques for cleaning objects. More particularly, the invention provides a technique including a method for cleaning objects using a combination of a high energy light source and electrostatic bias for removing impurities, such as particles and the like from integrated circuits, for example. But it will be recognized that the invention has a wider range of applicability; it can also be applied to other devices such as three-dimensional packaging of integrated semiconductor devices, photonic devices, opto-electronic devices, piezoelectronic devices, microelectromechanical systems ("MEMS"), sensors, actuators, solar cells, flat panel displays (e.g., LCD, AMLCD), biological and biomedical devices, and the like.

As integrated circuit device sizes become smaller, it is more desirable to remove particulate contamination from surfaces of such devices. Many techniques have been proposed or used to remove such particulate contamination. In the early days, such techniques have been limited to wet processing methods. These wet processing methods include a cascade rinse. The cascade rinse often utilizes a cascade rinser which includes inner and outer chambers, each separated by a partition. Rinse water flows from a water source into the inner chamber. The rinse water from the inner chamber cascades into the outer chamber. An in-process wafer such as an etched wafer is typically rinsed in the cascade rinser by dipping the etched wafer into the rinse water of the inner chamber. This process is often used to neutralize and remove acid from the etched wafer, which often remains in the rinse chamber to create particulate contamination problems.

Another technique often used to rinse wafers is the "quick dump" method. The quick dump method relies upon the rapid deployment of water from the rinse tank to remove water and impurities from the semiconductor wafer. A limitation with this method is its inability to actually clean or remove particles from the wafer. In fact, the rapid deployment of water from the tank often transfers more particles onto the wafer. In addition, the wafers from the quick dump tank must still undergo a drying operation, further increasing the number of particles on the wafer. As previously noted, more particles often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step often removes the water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to certain problems such as greater downtime, wafer breakage, more spare parts, greater costs, among others. A further limitation is static electricity often builds up on the wafers during the spin cycle, thereby attracting even more particles onto the surface of the semiconductor. Accordingly, the spin rinse/drying does not clean or remove particles from the wafer.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. A limitation with this type of dryer is its use of the large solvent quantity, which is hot, highly flammable, and extremely hazardous to health and the environment.

Several dry techniques have also been used. For example, silicon wafers have been cleaned using an argon/nitrogen cryogenic aerosol process. Such dry technique has had many promising characteristics, but has had limited use in the manufacture of integrated circuits so far. Other techniques that have been proposed but still lack wide acceptance in the manufacture of integrated circuits. Such techniques often require the use of expensive equipment, chemicals, and the like. Additionally, such techniques have proved not to be significantly effective for cleaning silicon wafers.

From the above, it is seen that an improved method for cleaning objects is highly desirable.

SUMMARY OF THE INVENTION

According to the present invention, a technique including a method for manufacturing objects is provided. More particularly, the invention provides a technique including a method for cleaning objects using a combination of a high energy light source and electrostatic bias for removing impurities, such as particles and the like from integrated circuits, for example. But it will be recognized that the invention has a wider range of applicability; it can also be applied to other devices such as three-dimensional packaging of integrated semiconductor devices, photonic devices, opto-electronic devices, piezoelectronic devices, microelectromechanical systems ("MEMS"), sensors, actuators, solar cells, flat panel displays (e.g., LCD, AMLCD), biological and biomedical devices, and the like.

In a specific embodiment, the present invention provides a method for cleaning objects (e.g., wafers, integrated circuits, photonic devices, opto-electronic devices, piezoelectronic devices, microelectromechanical systems ("MEMS"), sensors, actuators, solar cells, flat panel displays (e.g., LCD, AMLCD), biological and biomedical devices) of particles (e.g., particulate contamination) that attach themselves to surfaces of the objects. The method includes applying high energy (e.g., photons) from a high energy source (e.g., flash lamp, laser, light) on a surface of a substrate to release one or more particles from the surface of the substrate while maintaining the substrate in a predetermined (e.g., vacuum, atmospheric) environment; and applying an electrostatic source directed to the substrate to attract the released one or more particles from the substrate to remove the one or more particles from the surface of the substrate. The force should be applied simultaneously with the high energy source in some embodiments. The method also removes the substrate from the predetermined environment.

In an alternative embodiment, the invention provides a method for cleaning objects of particles that attach themselves to surfaces of the objects and chamber cleaning. The method includes inserting a substrate into a chamber. A step of applying a high energy source on a surface of the substrate to release one or more particles from the surface of the substrate while maintaining the substrate in a predetermined (e.g., vacuum) environment of the chamber is also included. The method applies an electrostatic source comprising an electrode directed to the substrate to attract the released one or more particles from the substrate to remove the one or more particles from the surface of the substrate. The substrate is removed from the chamber. The steps above are repeated for one or more substrates, until the electrode becomes dirty and ineffective. The method then inserts a collector substrate into the chamber; and applies a high energy light source on the electrode to release one or more particles from the surface of the electrode while maintaining the electrode in the predetermined (e.g., vacuum) environment of the chamber. An electrostatic source is applied to the collector substrate to attract the released one or more particles from the electrode to the collection substrate to remove the one or more particles from the surface of the electrode to clean the electrode from the particles. The collector substrate permanently removes the particles from the electrode and other areas of the chamber. The method removes the collection substrate from the chamber.

Numerous benefits are achieved over pre-existing techniques using the present invention. In a specific embodiment, the invention provides a clean and dry cleaning process, which is free from harmful chemicals, gases, and the like. In other embodiments, the invention permanently removes particles, which cannot reattach themselves to the substrate. The invention can be implemented using conventional hardware and software, with some customization. The method can be applied to the manufacture of many types of objects, e.g., integrated circuits, disks, opto-electronic devices. In other aspects, the invention is also cluster tool compatible, which can be used with other processes. The invention can also be applied after a variety of integrated circuit device manufacturing processes, e.g., etching, pre-gate oxide formation, deposition, plating. The invention also provides a non-contact, dry, technique for removing a particle. In other aspects, the invention also prevents particles from reattaching onto surfaces of the object being processed. The invention is also clustertool compatible. Depending upon the application, one or more of these advantages may exist, but do not need to all exist to carry out the claims herein.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

According to the present invention, a technique including a method for cleaning objects is provided. More particularly, the invention provides a technique including a method for cleaning objects using at least a combination of a high energy light source and electrostatic bias for removing impurities, such as particles and the like from integrated circuits, for example. But it will be recognized that the invention has a wider range of applicability; it can also be applied to other devices such as three-dimensional packaging of integrated semiconductor devices, photonic devices, opto-electronic devices, piezoelectronic devices, microelectromechanical systems ("MEMS"), sensors, actuators, solar cells, flat panel displays (e.g., LCD, AMLCD), biological and biomedical devices, and the like.

Figure 1:
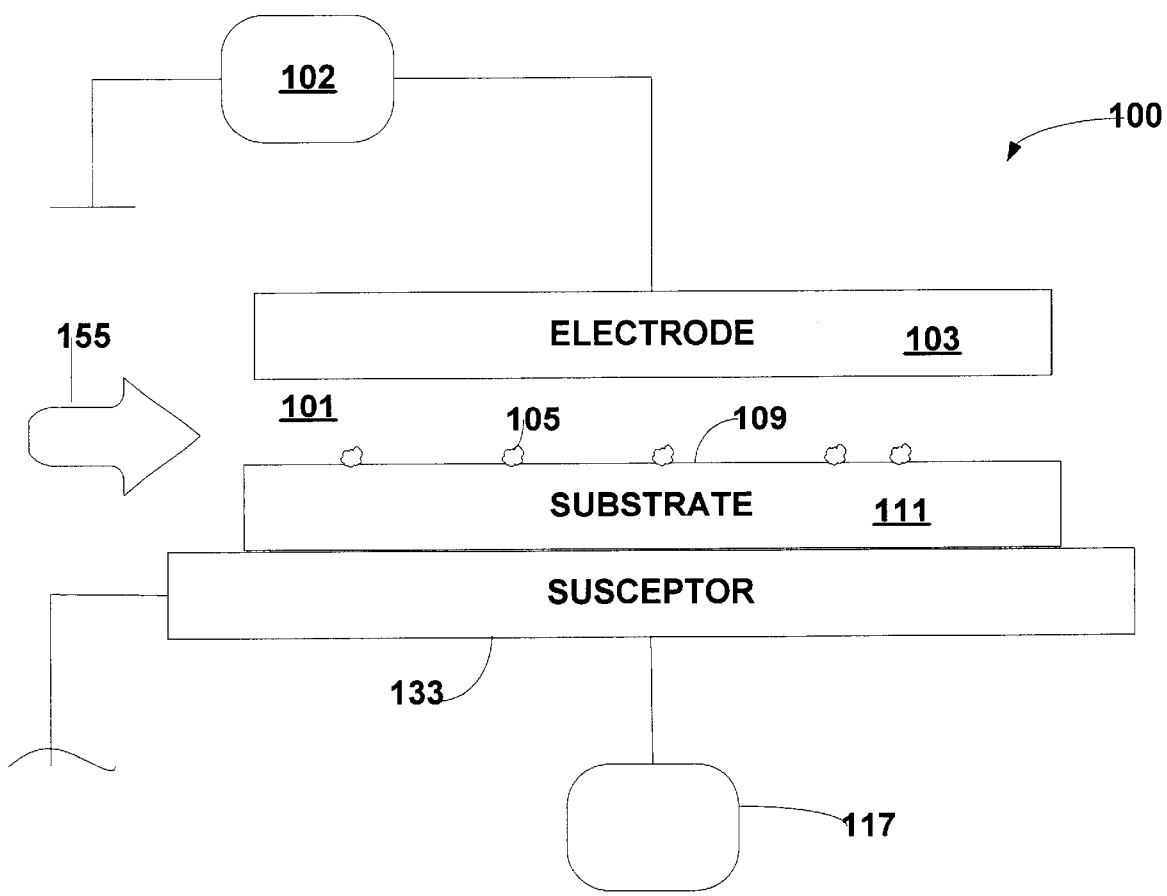
FIGS. 1–3 are simplified cross-sectional view diagrams of methods according to embodiments of the present invention.
Figure 2:
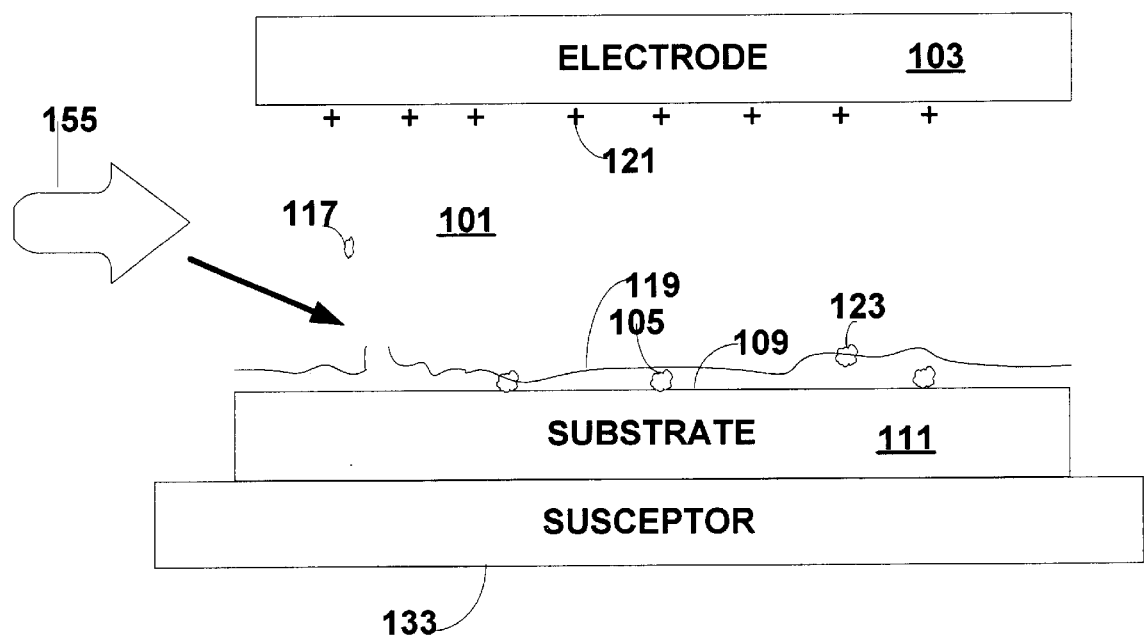
Figure 3:
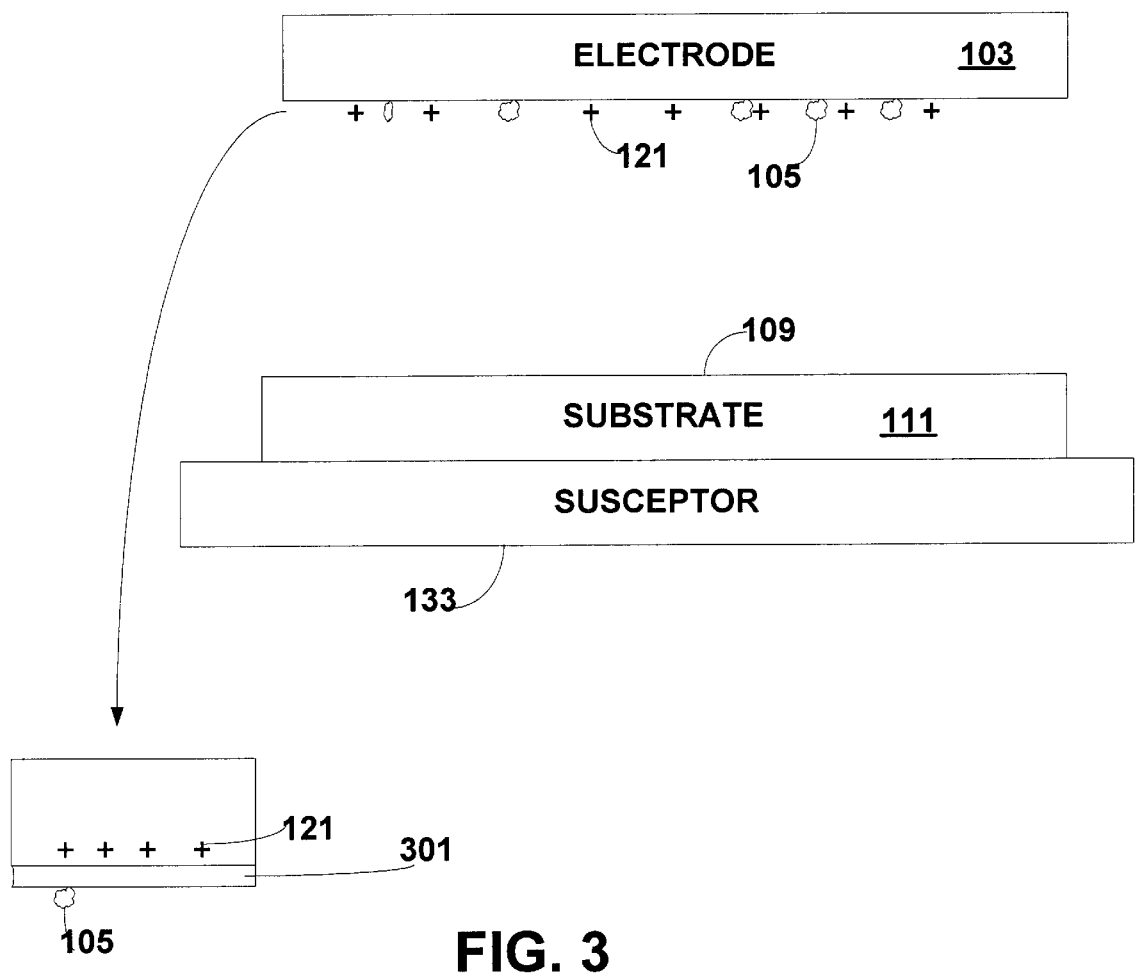

FIGS. 1–3 are simplified cross-sectional view diagrams 100 of methods according to embodiments of the present invention. These diagrams are merely examples, which should not limit the scope of the claims herein. One of ordinary skill in the art would recognize many other variations, modifications, and alternatives. As shown, the diagrams 100 include common reference numbers, which are used for cross-referencing purposes only. The diagrams include a susceptor 133, which holds substrate 111. The susceptor can include a mechanical clamp, electro-static clamp, or other attachment means. Preferably, the susceptor has an electrostatic clamp for cleanliness purposes. The substrate can be a silicon wafer, a multilayered wafer, a three-dimensional packaging of integrated semiconductor devices, substrate for photonic devices, opto-electronic device substrate, piezoelectronic device substrate, microelectromechanical systems ("MEMS"), sensor substrate, actuator substrate, solar cell panel, flat panel display (e.g., LCD, AMLCD), biological and biomedical chip, and the like The substrate has upper surface 109. The surface can be flat or annular. The surface can be patterned or smooth. The surface has a plurality of particulate contamination 105. The particles often include a size of 1 micron and less, or 0.5 micron and less, or 0.25 micron and less, or 0. 1 micron and less, or 0.05 micron and less. The upper surface faces electrode 103, which is biased using voltage source 102 to attract any released particles. The bias also creates an electric field for the particles to traverse through from the substrate to the electrode. Further details of such electrode are provided below.

In a specific embodiment, the substrate is placed under a vacuum 101, which is maintained in a chamber. The vacuum can be less than an atmosphere or can be less than a microtorr range, or less than a millitorr range. In some embodiments, the vacuum is not required. The particles face an electrode 103, which is biased using external voltage source 102. The electrode is made of a suitable material to charge it in either a positive bias or negative bias as related to particles. The bias is a static bias or can be a time varying bias depending upon the application. The electrode is preferably biased relative to the susceptor, which holds the substrate in bias. The bias creates an electric field between the susceptor and the electrode. In a specific embodiment, the particles on the surface will be directly charged or capacitively charged or a combination of both. The particles travel along the electric field lines.

The invention also includes an energy source 115 to dislodge the particles. The energy source can be any suitable means for providing a high energy light (e.g., photons) to the particles. The high energy light can include a laser, a flash lamp, and the like. The laser can be selected from an argon ion, Nd:YLF, Nd:YAG, XeCl, KrF, and ArF, and any of its harmonics or variance. Carbon dioxide can also be used in some embodiments. The energy source provides a burst, a pulse, flash, or beam of photons, which dislodge the particles. from the substrate. The energy source can be applied simultaneously with the electrode bias in some embodiments.

As shown, the diagram also includes a current meter 117, which measures current that can be converted into the number of particles that have been released. The current meter can be any suitable unit that couples to the susceptor and/or electrode 103. In some embodiments, the current meter can be coupled to a controller to provide an end point detection process, which determines the time when the substrate is clean. Further details of the current meter process are described below.

Referring to FIG. 2, the high energy light source provides a photon(s) to release particle 117. The light source is adjusted with a suitable wavelength, period, and flux to release the particle. The wave length is less than one micron in some embodiments. The light source can be pulsed, varied, or flood. The particle is released from the substrate, which is often covered with a boundary layer 119, which holds the particles in place. As shown, once the particle has been released, an electrostatic force moves the particle toward the electrode. In the present embodiment, the force is a positive bias 121. The source of photons also release other particles from the surface of the substrate as shown. The photons continue to release the particles and are attracted toward the electrode, which trap the particles, as shown in FIG. 3. The particle generally travels along the electric field lines between the substrate and the electrode. In a specific embodiment, the electrode can be covered with a material to enhance attraction and trapping of the particles. In a preferred embodiment, the electrode surface is covered with a dielectric material 301, which holds the particles firmly in place, as also shown by the Fig. Here, the particles generally do not and cannot be released back to the surface of the substrate in some embodiments during the cleaning process. Further details of these Figs. can be illustrated in the energy diagram shown below.

Although the above configuration has been shown using a specific configuration between the electrode, light source, and substrate, many other configurations can also exist. For example, the electrode and light source can be combined together in a configuration to scan the light across the substrate to release any particles, while the electrode also scans across the substrate to attract and permanently remove the particles from the substrate. The electrode can also be fixed. Alternatively, the electrode can be scanned while the light source is fixed. One of ordinary skill in the art would recognize many other variations, modifications, and alternatives.

Figure 4:
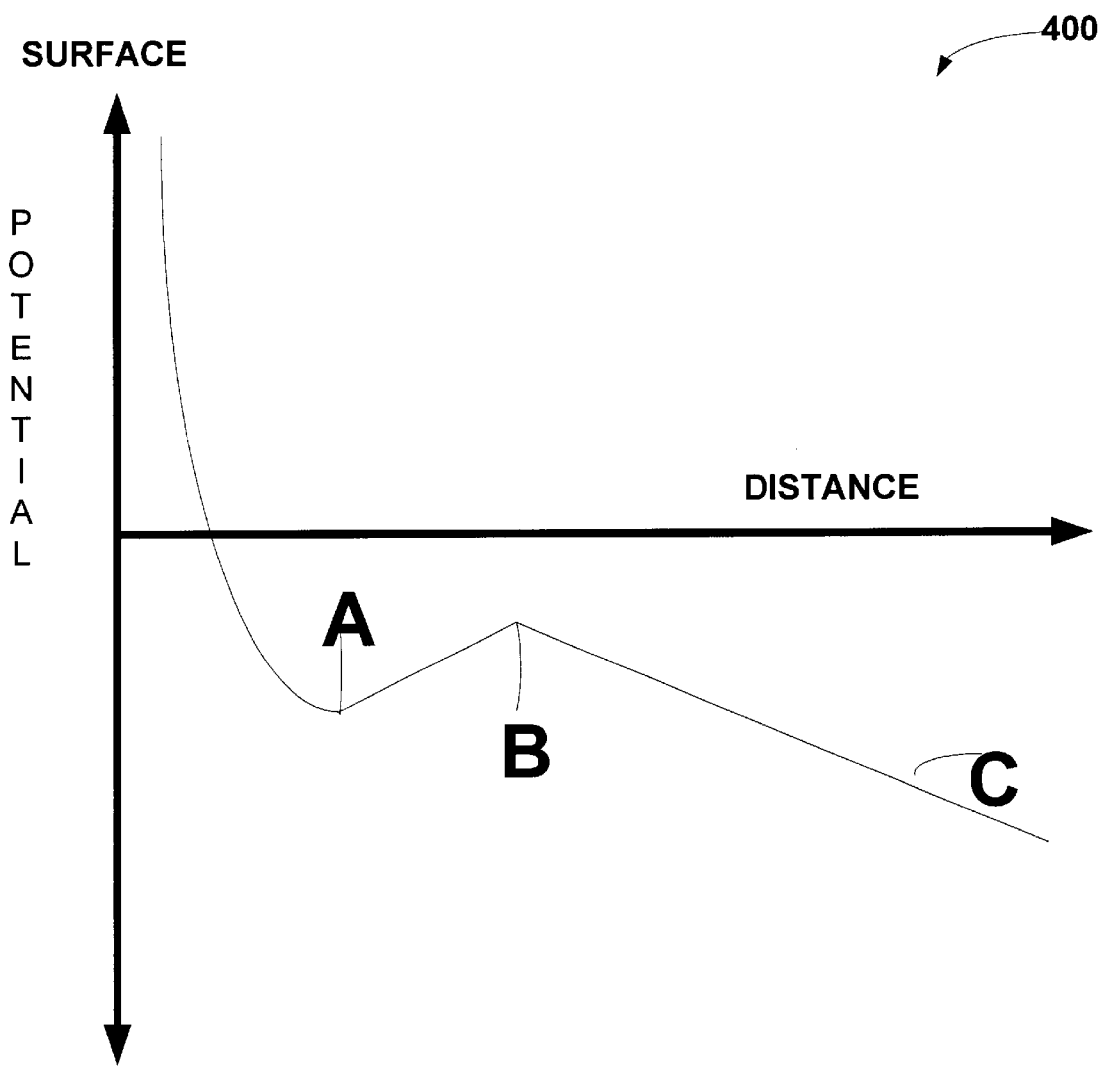
FIG. 4 is a simplified cross-sectional view diagram of potential plotted against distance according to an embodiment of the invention.

FIG. 4 is a simplified cross-sectional view diagram 400 of a energy potential plotted against distance according to an embodiment of the invention. This diagram is merely an example, which should not limit the scope of the claims herein. One of ordinary skill in the art would recognize many other variations, modifications, and alternatives. As shown, the diagram plots an energy potential against distance, which begins at the surface of the substrate. Here, the vertical axis represents energy potential, and the horizontal axis represents distance. The intersection between the vertical axis and the horizontal axis represents the surface of the substrate, where the distance extends out toward the electrode in a normal manner relative to the surface of the substrate.

An energy potential curve is shown in the plot. The plot has a high potential region near the surface, where the force between the particle and the surface actually become repulsive as the particle presses into the surface. Next to the surface of the substrate, the potential goes to infinity, ideally. The potential decreases until point A is reached, where the potential is predominantly attractive between the particle and the surface. In a specific embodiment, the attraction may include Van der Walls forces or the like. Referring to FIG. 2, for example, the relative minimum value is represented by particle 105, which is also shown in FIG. 4 as point A. Particle 105 represents an equilibrium point where the particle sticks to the surface from attractive forces between the particle and the surface. As the particle pulls away from the surface and tries to escape the boundary region, the particle (shown at point B) becomes attracted back toward the surface again, which represents a second relative minimum point. Here, particle 123 in the FIG. 2 illustrates such a particle. As shown, the attractive force at point B shows a higher potential than the particle at point A. In a preferred embodiment, the particle is released from the surface using a high energy light source, such as the one noted above, when the particle is at point A or point B. Once the particle escapes the boundary region, the particle is represented by point C in the Fig. Here, the particle is also shown by particle 117 in FIG. 2. The particle is released from the boundary layer and traverses toward the electrode, which attracts and holds the particle onto the electrode. Once the particle has been attached to the electrode, it is not free to reattach to the substrate. The above is merely an illustration on how I believe the mechanism of the invention is achieved. There can be many modifications, alternatives, and variations, which should not be limited except for by the claims herein.

In a specific embodiment, the invention can also provide a convection source (shown also as reference numeral 155) to add a convection force to the particle to facilitate detachment of the particle. The convection source can include a heat source, a gas source, an inert particle (non contaminating) source, a fluid source, any combination of these, and the like. In one embodiment, the convection force can be applied to the surface of the substrate in a laminar manner relative to the surface, where the particles are detached from the substrate and traverse through the flow lines and electric field lines. Here, the convection force is applied simultaneously with the photons from the energy source. Alternatively, the conductive force can be applied during a portion of time that the photons are applied to the surface. Alternatively, the conductive force can be applied after the photons are applied to the surface. It would be recognized that there can be many other variations, modifications, and alternatives. Still further the convection force can be applied with the electric field. Here, the convection force can be applied simultaneously with the electric field, or during a portion of time that the electric field is applied, or other variations. Details of such electric field are provided more particularly below.

Figure 5:
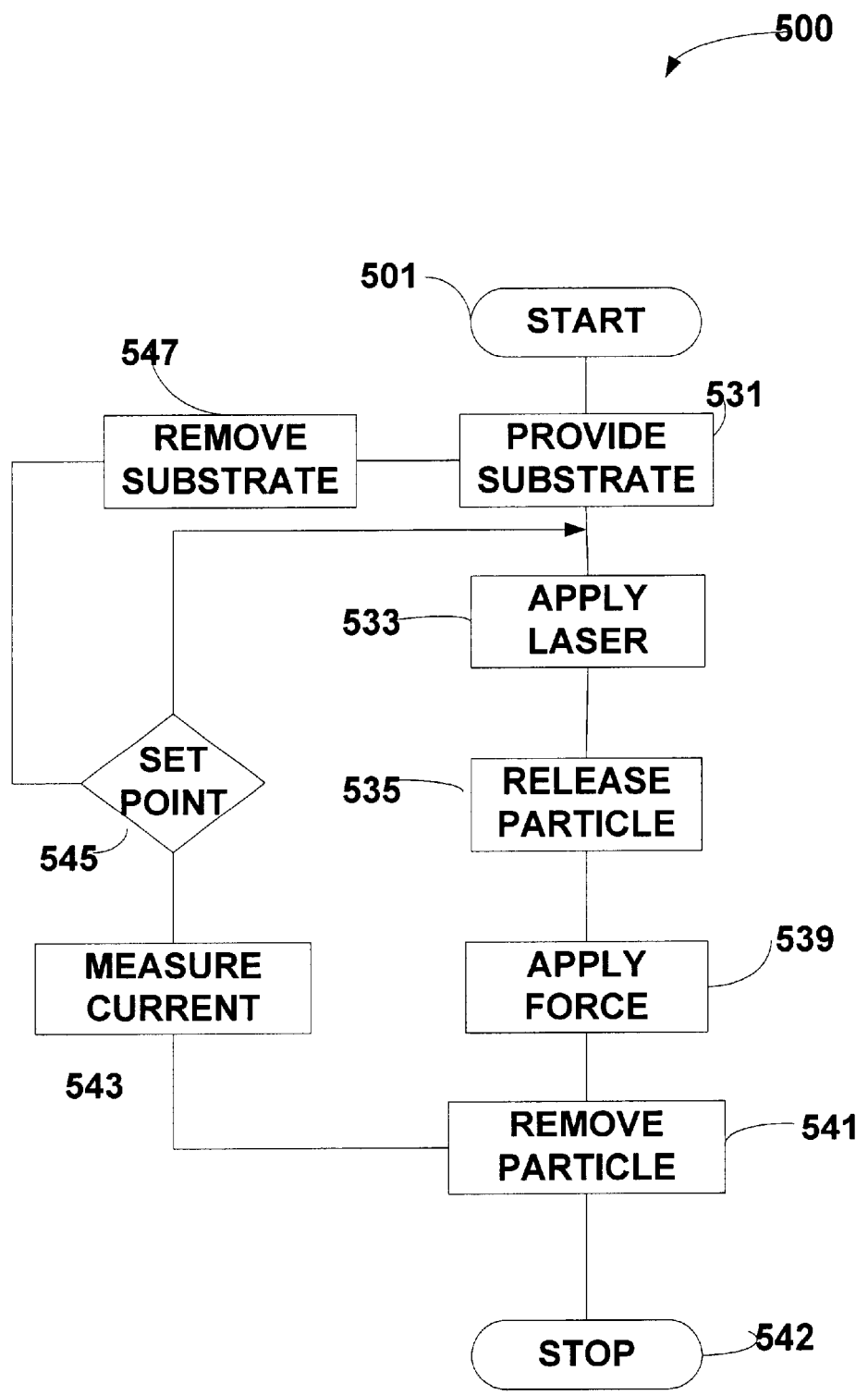
FIG. 5 is a simplified flow diagram of a method according to an embodiment of the present invention.

FIG. 5 is a simplified flow diagram 500 of a method according to an embodiment of the present invention. This diagram is merely an example, which should not limit the scope of the claims herein. One of ordinary skill in the art would recognize many other variations, modifications, and alternatives. As shown, the method begins with start, step 531. In a specific embodiment, the method provides a substrate into a cleaning tool, which includes a chamber, a susceptor, and other elements noted above. The cleaning tool is described in one of the applications noted above, which has been incorporated by reference. The susceptor can include a mechanical clamp, electrostatic clamp, or other attachment means. Preferably, the susceptor has an electrostatic clamp for cleanliness purposes. The substrate can be a silicon wafer, a multilayered wafer, a three-dimensional packaging of integrated semiconductor devices, substrate for photonic devices, opto-electronic device substrate, piezo-electronic device substrate, microelectromechanical systems ("MEMS"), sensor substrate, actuator substrate, solar cell panel, flat panel display (e.g., LCD, AMLCD), biological and biomedical chip, and the like.

In a specific embodiment, the substrate has an upper surface. The surface can be flat or annular. The surface can be patterned or smooth. The surface has a plurality of particulate contamination. The particles often include a size of 1 micron and less, or 0.5 micron and less, or 0.25 micron and less, or 0.1 micron and less, or 0.05 micron and less. The substrate is placed in a chamber, which is pumped down to form a vacuum in some embodiments. The vacuum can be less than an atmosphere or can be less than a microtorr range, or less than a millitorr range. In some embodiments, vacuum is not required. The surface of the substrate including particles face an electrode, which is biased using an external voltage source. The electrode is made of a suitable material to charge it in either a positive bias or negative bias as related to particles. The bias is a static bias or can be a time varying bias depending upon the application. The electrode is preferably biased relative to the susceptor, which holds the substrate in bias.

The method goes to step 533 which applies an energy from an energy source to dislodge the particles. The energy source can be any suitable means for providing a high energy light (e.g., photons) to the particles. The high energy light can include a laser, a flash lamp, and the like. The laser can be selected from an argon ion, Nd:YLF, Nd:YAG, XeCl, KrF, and ArF, and any of its harmonics or variance. The energy source provides a burst, a pulse, flash, or beam of photons, which dislodge the particles from the substrate. In a specific embodiment, the method is substantially free from the use of an electron gun, which may charge the particle. Alternatively, the invention can be used with an electron gun to charge the particle.

In a specific embodiment, the method can also provide a convection source to add a convection force to the particle-to facilitate detachment of the particle.; The convection source can include a heat source, a gas source, an inert particle (non contaminating) source, a fluid source, any combination of these, and the like. In one embodiment, the convection force can be applied to the surface of the substrate in a laminar manner relative to the surface, where the particles are detached from the substrate and traverse through the flow lines and electric field lines. Here, the convection force is applied simultaneously with the photons from the energy source. Alternatively, the conductive force can be applied during a portion of time that the photons are applied to the surface. Alternatively, the conductive force can be applied after the photons are applied to the surface. It would be recognized that there can be many other variations, modifications, and alternatives. Still further the convection force can be applied with the electric field. Here, the convection force can be applied simultaneously with the electric field, or during a portion of time that the electric field is applied, or other variations. Details of such electric field are provided more particularly below.

The method releases the particle from the surface, step 535. In one embodiment, it is believed that the particle is detached from the surface of the substrate and then is freed from a boundary layer, which covers the surface of the substrate, including the particle. The particle is released from the boundary-layer to become free from it. The method applies a force (step 539) between the substrate and the electrode. The force can be an electro-static force on the electrode, which attracts the particle toward the electrode along electric field lines generated between the electrode and the substrate. The electrode holds the particle in place once the particle reaches the surface of the electrode. Once the particle has been attached to the electrode, it is permanently removed from the substrate, step 541, during the process. The particle also generally cannot reattach itself back onto the substrate, which is common using conventional techniques.

In a specific embodiment, the method also uses a current meter, which measures (step 543) a current, which translates into the number of particles that have been released. The current meter can be any suitable unit that couples to the susceptor and/or electrode. The current meter measures the current, until a desired set point a reached, step 545. Once the set point has been reached, the method continues to the next step. In a preferred embodiment, the desired set point is a zero or no current condition. Here, no particles are being removed at this current condition. Alternatively, the method continues via an alternative branch and goes through the steps again until the set point has been reached. The method stops at step 542.

Figure 6:
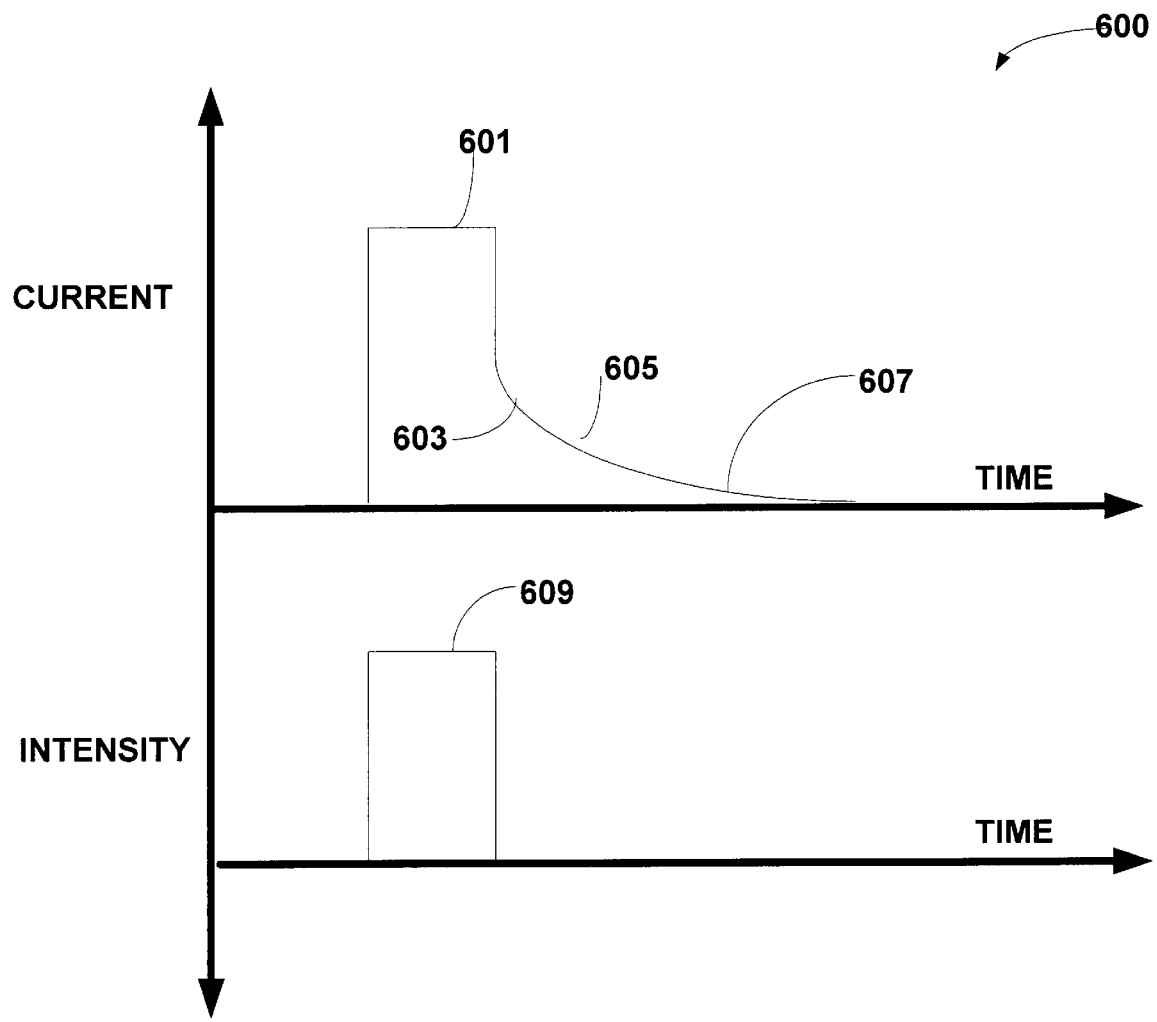
FIG. 6 is a simplified diagram of a current profile according to an embodiment of the present invention

As merely an example, FIG. 6 is a simplified diagram 600 of a current profile according to an embodiment of the present invention. This diagram is merely an example, which should not limit the scope of the claims herein. One of ordinary skill in the art would recognize many other variations, modifications, and alternatives. As shown, the horizontal axis represents time, which extends from the vertical axis. The upper vertical axis represents current and the lower vertical axis represents intensity, where the time axis is common to each of them. As shown, the diagram of intensity shows a pulse of light 609, which is applied from the source to the surface of the substrate. The pulse can be shaped as a rectangle, for example. A current profile 601 is measured, where a pulse 601 of current extends along an edge 603, which decreases along region 605 to 607 of the profile. I believe that smaller mass particles will be removed in region 603, which has a larger current than region 605, but smaller than region 601. Charged or larger mass particles will be removed in region 605, which shows a larger current than region 607, but smaller than region 603. Region 607 will be indicative of larger mass particles. This diagram is merely an illustration, which should not limit the claims herein.

Although the above has been described in terms of a specific sequence of steps, it would be recognized that many variations could exist. For example, any of the above steps can be combined or even further separated. Some of the steps could also be exchanged for others. Additionally, the current monitoring process can be made in-situ or during the steps of applying the laser, releasing the particle, applying the force, and removing the particle, or without some of these steps. One of ordinary skill in the art would recognize many variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of cleaning objects in the chamber from particles, that attach themselves to surfaces of the objects, comprising:

inserting a substrate into a chamber;

applying a high energy photon from a light source on a surface of the substrate to release one or more particles from the surface of the substrate while maintaining the substrate in a vacuum environment of the chamber;

applying an electrostatic force from an electrode directed to the substrate to attract the released one or more particles from the substrate to remove the one or more particles from the surface of the substrate;

removing the substrate from the chamber;

repeating the steps of applying the high energy photon from the electromagnetic energy source, applying the electrostatic force from the electrode and removing the substrate;

inserting a collector substrate into the chamber;

applying a high energy photon from the light source on the electrode to release one or more particles from the surface of the electrode while maintaining the electrode in the vacuum environment of the chamber;

applying an electrostatic force from the electrode directed to the collector substrate to attract the released one or more particles from the electrode to the collector substrate to remove the one or more particles from the surface of the electrode to clean the electrode from the particles; and removing the collector substrate from the chamber.

2. The method of claim 1 wherein the light source is selected from an argon ion, Nd:YLF, Nd:YAG, XeCl, KrF, and ArF, and any of its harmonics and/or variance.

3. The method of claim 1 wherein the electrostatic source comprises a first mode and a second mode, the first mode providing a positive voltage potential relative to the particles and the second mode providing a negative voltage potential relative to the particles.

4. The method of claim 3 wherein the first mode is provided during the step of removing the particles from the substrate and the second mode is provided during the step of removing the particles from the electrode.

5. The method of claim 1 wherein the particles are less than about 0.1 micron in dimension.

6. The method of claim 1 wherein the particles are less than about 0.05 micron in dimension.

7. The method of claim 1 wherein the light source is pulsed and/or flashed.

8. The method of claim 1 wherein the substrate is selected from a wafer, a partially completed wafer, a hard disk, an optical device, a biological device, and an integrated circuit device.

9. The method of claim 1 wherein further comprising measuring an electric current at the electrode.

10. A method of cleaning objects in a chamber from particles, that attach themselves to surfaces of the objects, comprising:

inserting a substrate into a vacuum chamber;

applying a plurality of high energy photons from a light source on a surface of the substrate to release one or more particles from the surface of the substrate;

applying an electrostatic force from an electrode directed to the substrate to attract the released one or more particles from the substrate to remove the one or more particles from the surface of the substrate;

removing the substrate from the chamber;

inserting a collector substrate into the chamber;

applying a plurality of high energy photons on the electrode to release one or more particles from the surface of the electrode;

applying an electrostatic force from the electrode directed to the collector substrate to attract the released one or more particles from the electrode to the collector substrate to remove the one or more particles from the surface of the electrode to clean the electrode from the particles; and removing the collector substrate from the chamber.

11. The method of claim 10 wherein the plurality of photons are from a high energy source, the high energy source being selected from an argon ion, Nd:YLF, Nd:YAG, XeCl, KrF, ArF laser source, and any of its harmonics or variance.

12. The method of claim 10 wherein the electrostatic force is from an electrostatic source, the electrostatic source comprising a first mode and a second mode, the first mode providing a positive voltage potential relative to the particles and the second mode providing a negative voltage potential relative to the particles.

13. The method of claim 12 wherein the first mode is provided during the step of removing the particles from the substrate and the second mode is provided during the step of removing the particles from the electrode.

14. The method of claim 10 wherein the particles are less than about 0.1 micron in dimension.

15. The method of claim 10 wherein the particles are less than about 0.05 micron in dimension.

16. The method of claim 10 wherein plurality of photons are flashed.

17. The method of claim 10 wherein the light source is pulsed or flashed.

18. The method of claim 10 wherein the substrate is selected from a wafer, a partially completed wafer, a hard disk, an optical device, a biological device, and an integrated circuit device.

19. The method of claim 10 wherein further comprising measuring an electric current at the electrode.

20. The method of claim 10 wherein the plurality of photons are pulsed.

21. The method of claim 10 wherein the plurality of photons are flood.

22. The method of claim 10 wherein the substrate is a semiconductor wafer.

23. The method of claim 10 wherein the collector substrate is a semiconductor wafer.

24. The method of claim 10 wherein the collector substrate comprises the one or more particles.

* * * * *